United States Patent [19]

Boland

[11] Patent Number: 4,636,269

[45] Date of Patent: Jan. 13, 1987

[54] EPITAXIALLY ISOLATED SEMICONDUCTOR DEVICE PROCESS UTILIZING ETCH AND REFILL TECHNIQUE

[75] Inventor: Bernard W. Boland, Scottsdale, Ariz.

[73] Assignee: Motorola Inc., Schaumburg, Ill.

[21] Appl. No.: 750,969

[22] Filed: Jul. 2, 1985

Related U.S. Application Data

[63] Continuation-in-part of Ser. No. 553,326, Nov. 18, 1983, Pat. No. 4,609,413.

[51] Int. Cl.$^4$ .................. H01L 21/205; H01L 21/76
[52] U.S. Cl. ...................................... 148/175; 29/571; 29/576 E; 29/576 W; 29/577 C; 29/578; 29/580; 148/DIG. 26; 148/DIG. 50; 148/DIG. 85; 156/612; 156/649; 156/657; 156/662; 357/48
[58] Field of Search ................ 29/571, 576 E, 576 W, 29/577 C, 578, 580; 148/175, DIG. 26, DIG. 50, DIG. 85; 156/612, 649, 653, 657, 662; 357/48

[56] References Cited

U.S. PATENT DOCUMENTS

| | | | |
|---|---|---|---|
| 3,370,995 | 2/1968 | Lowery et al. ..................... | 148/175 |
| 3,456,169 | 7/1969 | Klein ..................................... | 29/571 |
| 3,566,220 | 2/1971 | Post ..................................... | 148/175 X |
| 3,575,731 | 4/1971 | Hoshi et al. ..................... | 148/175 X |
| 3,587,166 | 6/1971 | Alexander et al. ............. | 148/175 X |
| 3,740,276 | 6/1973 | Bean ..................................... | 29/580 |
| 3,753,803 | 8/1973 | Nomura et al. ..................... | 148/175 |
| 3,764,409 | 10/1973 | Nomura et al. ................... | 29/580 X |
| 3,793,712 | 2/1974 | Bean et al. ..................... | 148/175 X |
| 3,853,644 | 12/1974 | Taruo et al. ................. | 148/DIG. 50 |
| 4,056,413 | 11/1977 | Yoshimura ......................... | 148/175 |
| 4,089,021 | 5/1978 | Sato et al. .................. | 148/DIG. 50 |
| 4,346,513 | 8/1982 | Nishizawa et al. ................... | 29/580 |
| 4,566,174 | 1/1986 | Yasuda et al. ................... | 29/576 W |

FOREIGN PATENT DOCUMENTS 1144850 3/1969 United Kingdom ....... 148/DIG. 50

OTHER PUBLICATIONS

Chao et al., "Heavy Doping Isolation for CMOS Integrated Circuits" IBM Tech. Disc. Bull., vol. 25, No. 7A, Dec. 82, pp. 3350–3352.
Doo, V. Y., "High Capacitance PN Junction Capacitors by Etch Refill Method" IBM Tech. Disc. Bull., vol. 9, No. 7, Dec. 1966, pp. 920–921.
Doo, V. Y., "Junction Isolation for Isolating Integrated Devices Formed by an Etch and Regrowth Technique" IBM Tech. Disc. Bull., vol. 8, No. 4, Sep. 1985, pp. 668–669.

Primary Examiner—William G. Saba
Attorney, Agent, or Firm—John A. Fisher; Raymond J. Warren

[57] ABSTRACT

A process is disclosed for manufacturing electrically isolated semiconductor device structures. The process includes the steps of providing a semiconductor substrate and selectively etching one surface of that substrate to form etched regions and unetched regions. In a single epitaxial growth step three separate epitaxial layers are grown overlying both the etched and unetched regions. The epitaxial layers are then shaped back to form a substantially planar surface and to expose portions of the first epitaxial layer. The exposed portion of the first epitaxial layer, in combination with the substrate, is suitable for the fabrication of a back contact power transistor. The second epitaxial layer, which follows the contour of the etched surface, bends upwardly and intersects the planar surface to substantially surround portions of the third epitaxial layer and to electrically isolate those portions of the third epitaxial layer from the substrate and first epitaxial layer. The portions of the third epitaxial layer are thus suitable for the implementation of an integrated control circuit function.

8 Claims, 16 Drawing Figures

EPITAXIALLY ISOLATED SEMICONDUCTOR DEVICE PROCESS UTILIZING ETCH AND REFILL TECHNIQUE

This application is a continuation-in-part of application Ser. No. 553,326 filed Nov. 18, 1983, now U.S. Pat. No. 4,609,413.

FIELD OF THE INVENTION

This invention relates generally to an improved process for fabricating semiconductor devices, and more specifically to an improved process for fabricating epitaxially isolated semiconductor device regions in juxtaposition with bottom-contact semiconductor device regions.

BACKGROUND ART

In the design and manufacture of semiconductor structures, particularly those containing both integrated control circuits and power devices, it is frequently desired to electrically isolate different device regions placed within the same semiconductor body. The need for such isolation is especially strong when control circuitry and power devices are used in the same semiconductor wafer or die. Control circuits are generally arranged to have all their device contacts on the top surface of the wafer or die where they may be readily interconnected. Power devices, on the other hand, often must utilize the entire thickness of the semiconductor die. This is especially true when very high voltage or very high current power devices are needed, when there must be a very high degree of isolation between the power devices and the control circuitry, or when large amounts of power must be handled. In this situation, one of the terminals of the power device must appear on the back or bottom surface of the semiconductor die. Such devices are referred to as bottom-contact devices. As used herein, the words "bottom-contact" are intended to refer to devices or device regions having at least one contact on the rear or bottom face of the die or wafer. Bottom-contact devices will generally also have other contacts on the front or top face of the die or wafer. As used herein, the words "top" or "front face" of the die or wafer are intended to refer to the surface where contacts to the control circuitry are generally placed. As used herein, the words "control circuits" or "control circuitry" are intended to refer to all manner of digital or linear devices, or combinations of devices, which may be used in conjunction with power devices, and which are integrated within the same semiconductor die as the power device.

Prior art semiconductor device structures and methods have not provided convenient means for obtaining bottom-contact power devices and top-contact control circuitry in the same semiconductor die, with electrical isolation therebetween. With the prior art, it has generally been necessary to use multiple masking steps involving etched grooves, buried layers, and/or deep side wall diffusions to create the isolation regions surrounding the areas in which the devices or circuits are to be constructed. These techniques are undesirably expensive and may limit the attainable device performance.

A further problem with prior art structures and methods is that the doping type, density, and gradient of the semiconductor regions used for constructing the power devices and those used for constructing the integrated control circuitry usually cannot be varied independently, or can only be varied with great difficulty or within narrow limits. For these reasons, prior art means and methods have limited the ability to independently optimize both the power devices and the integrated control circuitry in the same wafer or die.

Accordingly, it is an object of this invention to provide an improved process for epitaxially fabricating electrically isolated device regions.

It is another object of this invention to provide a process for fabricating electrically isolated device regions requiring only a single epitaxial growth operation.

It is a still further object of this invention to provide an improved process for fabricating epitaxially isolated structures having regions for top contact circuitry and regions for bottom contact devices.

It is yet another object of this invention to provide an improved process for fabricating isolated device regions of different resistivites in a single epitaxial growth operation.

BRIEF SUMMARY OF THE INVENTION

The foregoing and other objects and advantages of the invention are achieved from a process in which a semiconductor wafer is etched to form a patterned surface, a number of epitaxial layers are grown on the etched surface following the contours of the surface, and then the structure is shaped back to a planar surface including electrically isolated device regions. In one embodiment of the invention the top surface of a semiconductor substrate is selectively etched to form etched regions and unetched regions. First, second and third epitaxial layers are then formed overlying both the etched and unetched regions. The epitaxial layers are subsequentially conformal to and thus follow the contours of the etched surface. The epitaxial layers are then shaped back to expose a portion of the first epitaxial layer. The contours of the etched surface cause a bending in the epitaxial layers which, after shaping back, result in the second epitaxial layer bending upwardly and intersecting the newly formed surface to provide electrical isolation between the first and third epitaxial layers.

DETAILED DESCRIPTION OF PREFERRED EMBODIMENTS

FIGS. 1A–E show, in simplified form, a cross-sectional view through a device prepared according to the means and method of the present invention, at various stages of manufacture. Semiconductor substrate 10 is, in a preferred embodiment, covered by epitaxial layer 11. Semiconductor substrate 10 has a first conductivity and type, which may be the same or different than substrate 10. Epitaxial layer 11 has thickness 11c.

Figure 1A:
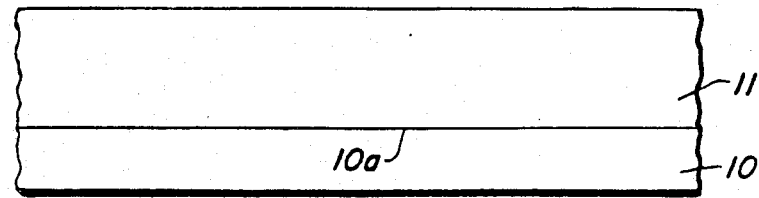
FIGS. 1A-E show, in simplified form, schematic cross-sections of a semiconductor device structure at different stages of manufacture, according to a first embodiment of the present invention.
Figure 1B:
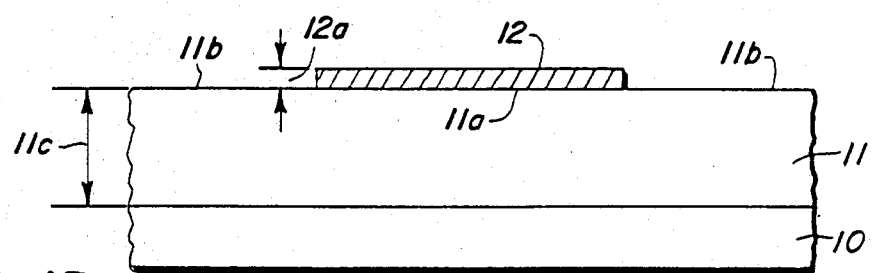
Figure 1C:
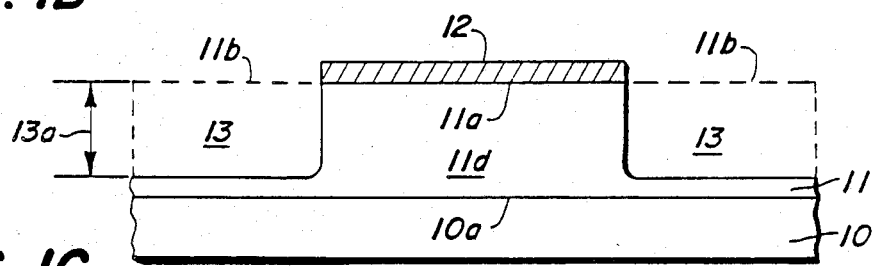

Surface 11a–b of layer 11 is covered by etch resistant masking layer 12 of thickness 12a which has been patterned, by means well known in the art, to provide covered surface portion 11a and exposed surface portions 11b on layer 11. Silicon dioxide is a useful material for masking layer 12. In FIG. 1C, exposed surface portions 11b of layer 11 are etched, using means well known in the art, to obtain recesses 13 of depth 13a in layer 11, and leaving behind pedestal 11d underneath covered surface portion 11a. The dotted line in FIGS. 1C–D outlines the portion of layer 11 that has been removed from exposed surface portions 11b. It is desirable that depth 13a be less than thickness 11c of layer 11. While it is desirable to utilize epitaxial layer 11, it is not mandatory. If layer 11 is omitted, then interface 10a between layer 11 and substrate 10 is absent. In this situation, the same sequence of steps is followed as illustrated in FIGS. 1A–E, 2A–C, and 3, but with layer 11 and its associated surfaces and pedestals treated as if they are part of substrate 10.

Figure 1D:
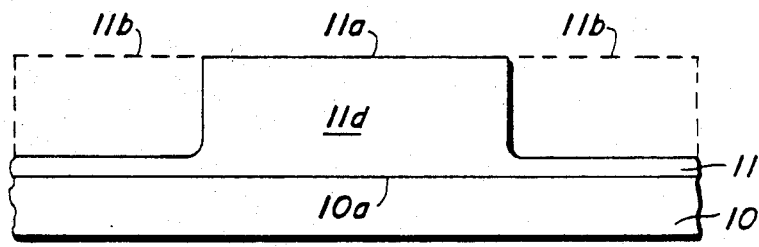
Figure 1E:
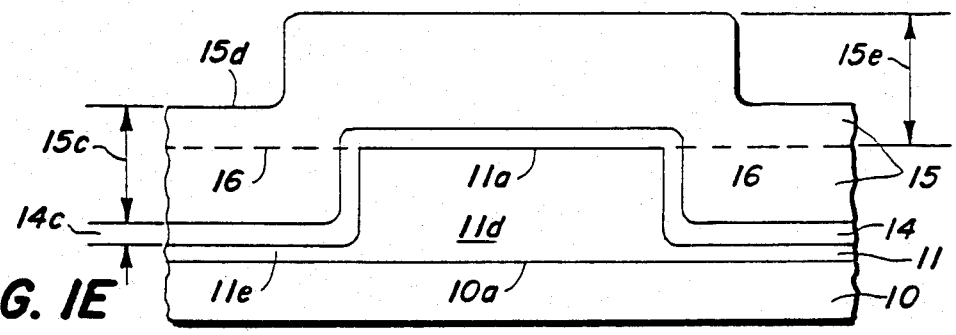
Figure 1F:
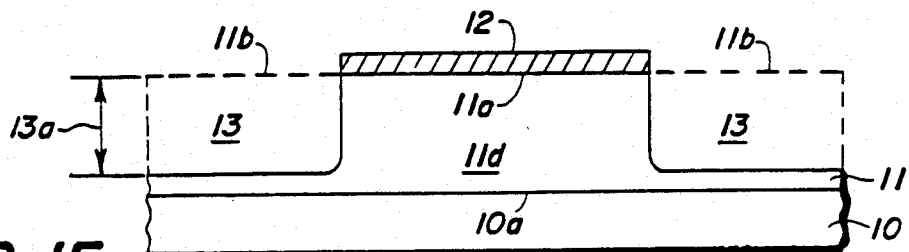

In a first embodiment of the method of the present invention, illustrated in FIGS. 1D–E, masking layer 12 is removed by means well known in the art, following which epitaxial layers 14 and 15 are formed one above the other on substrate 11. Layer 14 conformally coats layer 11, and has thickness 14c less than depth 13a. Layer 15 conformally coats layer 14 and has thickness 15c such that the sum of thickness 14c and thickness 15c equals or exceeds depth 13a. In this way, surface 15d of layer 15 lies even with or above the level, as shown by dotted line 16, of surface portion 11a of layer 11. Dotted line 16 is substantially coincident with the elevation of surface portion 11a of pedestal 11d.

Figure 3:
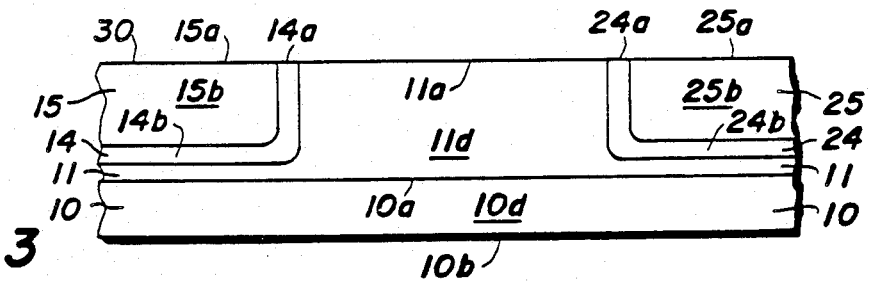
FIG. 3 shows, in simplified form, a schematic cross-section of a semiconductor device structure, according to the present invention, at a stage of manufacturing following the steps illustrated in FIGS. 1A-E or FIGS. 2A-C.

Using lapping, polishing, and/or etching techniques well known in the art, elevated portion or thickness 15e of layers 14 and 15, lying above dotted line 16, is removed to re-expose surface portion 11a of layer 11 and produce substantially the configuration shown in FIG. 3. The structure shown in FIG. 3 has a substantially planar surface 30 composed of surface portion 11a on top of pedestal 11d of layer 11, portion 14a of layer 14, and portion 15a of layer 15.

Figure 4A:
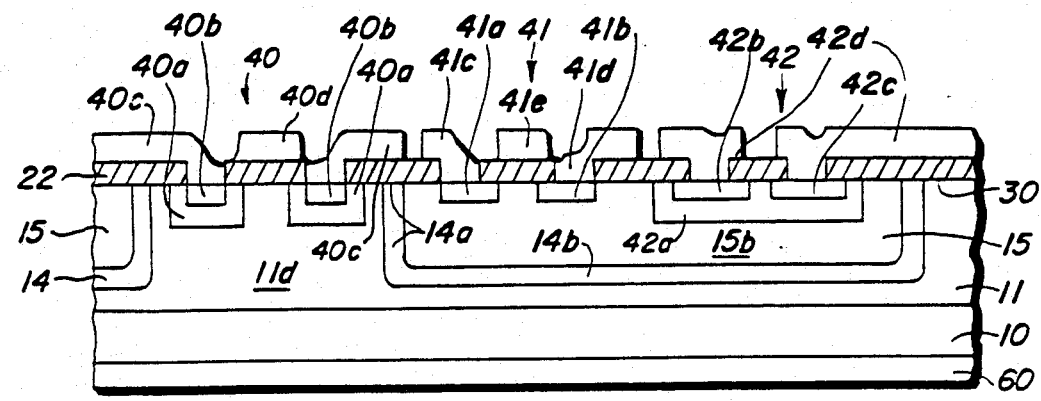
FIGS. 4A-C show, in simplified form, schematic cross-sections of several semiconductor device structures containing bottom-contact power devices and top-contact control devices, prepared according to the present invention.
Figure 4B:
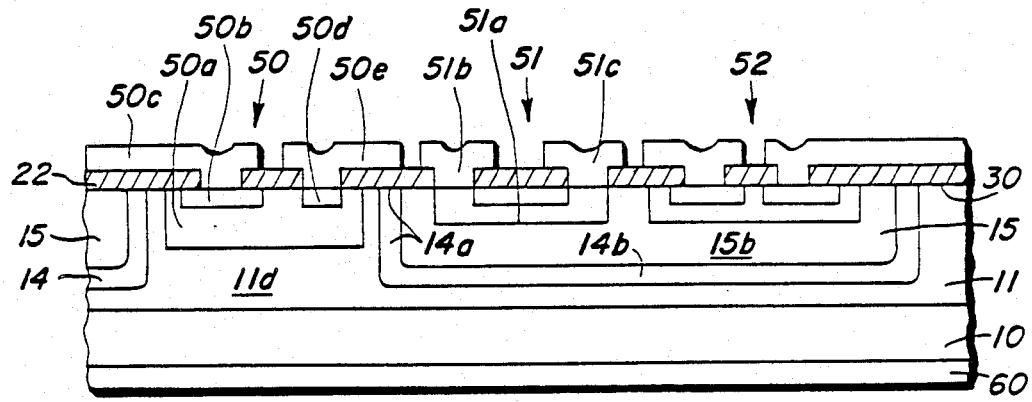
Figure 4C:
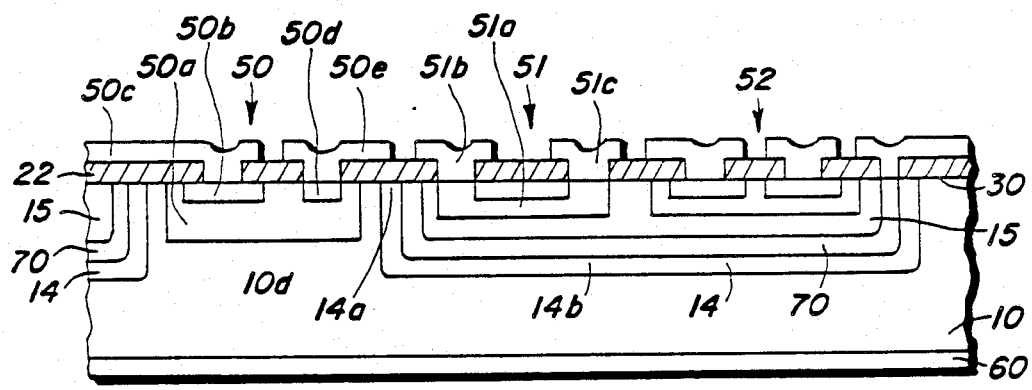

The structure of FIG. 3 has substantial advantages for the construction of bottom-collector devices and integrated, but isolated, control circuitry. Pedestal 11d provides a particularly convenient location in which a bottom-contact power device may be constructed. Surface portion 11a of pedestal 11d is a part of top surface 30. Pedestal 11d also communicates directly with substrate 10 at interface 10a and thus with bottom-contact surface 10b. In a typical n-type power transistor, substrate 10 forms the N+ collector or drain contact of the power transistor, and is accessible from bottom-contact surface 10b. Pedestal 11d in layer 11 is conveniently used as the drain region or collector region of the power device. For a 3-layer n-type device, layer 11 is conveniently formed from N− material. The source and body regions of an MOS device or the emitter and base regions of a bipolar device are conveniently constructed in surface portion 11a of pedestal 11d, as is illustrated in FIGS. 4A–C. Layer 14 is usually highly doped p-type, and layer 15 is usually lightly doped n-type. p+ layer 14, comprising buried portion 14b and vertical portion 14a, isolates portion 15b of N layer 15 from pedestal 11d of N− layer 11.

The type and conductivity of layers 11, 14, and 15 in FIGS. 1A–E may be varied independently by changing epitaxial growth conditions. In this way, layer 14 can be made of opposite conductivity type of layers 11 and 15 so as to provide isolation therebetween. Further, layer 11 can have its type, conductivity, and doping gradient optimized for construction of a bottom-contact power device in pedestal 11d, while layer 15 has its type, conductivity and doping gradient optimized for the construction of control circuitry in portion 15b. The means and method of the present invention allows the characteristics of the power device region (e.g. pedestal 11d), the isolation region (e.g. portions 14a–b), and the control circuitry region (e.g. region 15b) to be varied individually to accommodate conflicting device requirements. This is a substantial advantage over prior art approaches.

When the structure illustrated in FIG. 3 is formed with epitaxial layers, the doping range and gradients may be varied much more conveniently and in many situations over wider ranges than is possible with other fabrication techniques, such as diffusion and ion implanation. For example, in the prior art in which superimposed diffused regions are used, each successive diffused region must generally be doped to a level higher than the previous diffused region. Epitaxial layers are especially useful where the device regions must be thick in order to accommodate high voltages and/or provide a high degree of isolation. A further advantage of the present invention is that doping as a function of depth can be uniform. For example, vertical or wall portions 14a and buried portion 14b of layer 14 can both have the same dopant concentration and profile as a function of thickness, even though portion 14b is substantially parallel to the upper surface while portions 14a intersect the upper surface. This is not true with diffused isolation regions or layers, since the wall portions and buried portions are usually formed separately, and since the wall portions are generally diffused in from the surface and thus have higher dopant concentrations at the surface.

In the example of the power device which has been described above, when layer 11 is used, it is desirable that thickness 11c exceed depth 13a so that portion 11e of N− layer 11 remains between P+ isolation layer 14 and N+ substrate 10. This provides a higher breakdown voltage between substrate 10 and isolation layer 14.

It should also be noted that portion 14a of isolation layer 14 automatically appears at surface 30 so that a separate isolation wall diffusion or etch and refill step is not required. Thus, the present invention achieves isolation between regions 15b and 11d with fewer process steps than has been required in the prior art.

Figure 2A:
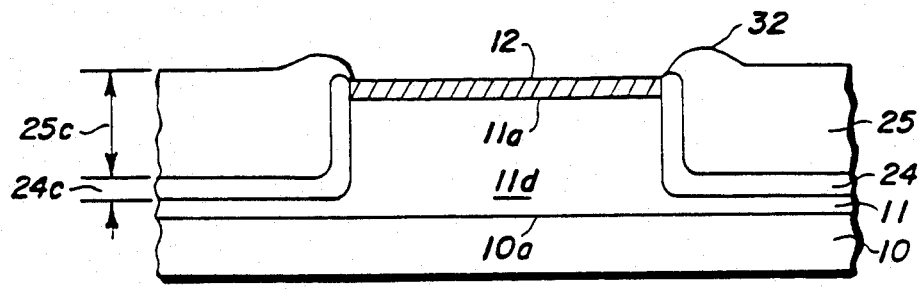
FIGS. 2A-C show, in simplified form, schematic cross-sections of a semiconductor device structure at different stages of manufacture, according to a further embodiment of the present invention.
Figure 2B:
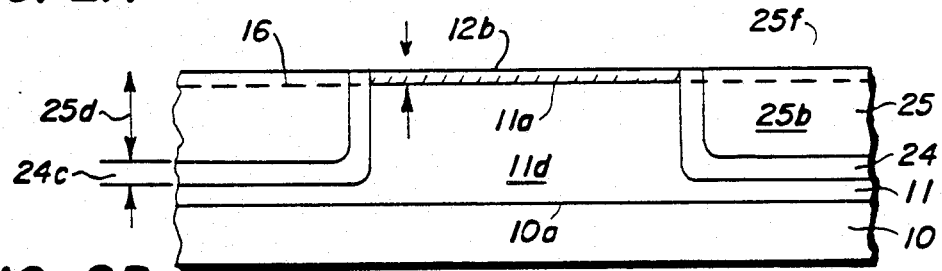
Figure 2C:
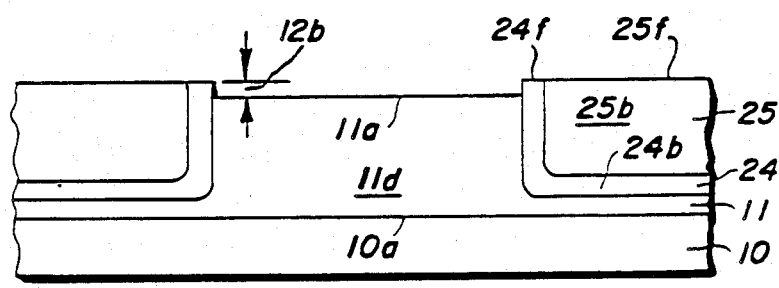

FIGS. 2A–C illustrate a further embodiment of the present invention for preparing the structure of FIG. 3. In this embodiment, after the steps shown in FIGS. 1A–C, layers 24 and 25 are deposited with mask layer 12 left in place (see FIG. 2A). Except for the difference in method of fabrication, layers 24 and 25 of FIGS. 2A–C and FIG. 3 correspond in function and properties to layers 14 and 15 of FIGS. 1A-E and FIG. 3. Where substrate 10 is silicon, it is convenient to form layers 11, 14, 15, 24, and 25 using chemical vapor deposition (CVD). CVD is a well known epitaxial deposition technique. Trichlorosilane and silicon tetrachloride mixed with hydrogen as a carrier gas are commonly used as sources of silicon. If a small amount of HCL is mixed in the hydrogen, then the silicon will preferentially deposit on silicon and there will be little deposition on mask 12. This technique is well known in the art. The result of this process is illustrated schematically in FIG. 2A. The same considerations with respect to thickness 24c of layer 24 and thickness 25c of layer 25 relative to depth 13a of recess 13 apply as in the case of thicknesses 14c and 15c of layers 14 and 15.

Using lapping, polishing, and/or etching techniques well known in the art, protrusions 32 of layers 24 and 25 are removed to yield the structure illustrated in FIG. 2B. During this process, there will be some thinning of mask 12 so that remaining thickness 12b is less than initial thickness 12e. One advantage of the procedure illustrated in FIGS. 2A-C is that layer 12 will generally have different lapping and/or etching characteristics than the adjacent semiconductor at 25f. Thus, mask 12 can be used as a polishing stop. A further advantage of retaining masking layer 12 is to prevent doping of surface 11a during deposition of layers 14 and 15.

Once protrusions 32 have been removed, as in FIG. 2B, remaining thickness 12b of mask 12 can be removed by etching, as shown in FIG. 2C. Thickness 12b is usually small compared to depth 13. The small difference in elevation between surface portion 11a and adjacent regions 24f and 25f, corresponding to remaining mask thickness 12b, usually will not interfere with further device processing and the structure of FIG. 2C can be used to construct devices such as illustrated in FIGS. 4A-C. However, if further planarization is desired, the structure of FIG. 3 is obtained by a slight additional polishing.

FIGS. 4A-C illustrate the use of the structure of FIG. 2C or FIG. 3 to build control circuitry and bottom-contact devices in the same semiconductor substrate. FIG. 4A shows MOS power device 40 formed in pedestal 11d. Device 40 is a TMOS type device in which substrate 20 with electrodes 60 serves as the drain region and contact. MOS device 40 has doped body regions 40a in which the channels are formed, source regions 40b, source contacts 40c, and gate electrode 40d. Dielectric layer 22 is conventional. Devices 41 and 42 are representative of control circuitry formed in isolated regions 15b, and comprise source region 41a, source contact 41c, drain region 41b, drain contact 41d, gate electrode 41e, base region 42a, base contact 42c, emitter 42b and electrodes 42d. It will be recognized by those of skill in the art that devices 41 and 42 are merely representative of the many device arrangements which can be used for control circuitry in conjunction with bottom-contact power device 40, and that the invention is not limited to these representative devices.

FIGS. 4B-C illustrate an alternative arrangement in which pedestal 11d or 10d is used to fabricate bipolar power device 50, comprising base 50a, emitter 50b, base contact 50d, and electrodes 50c and 50e. Substrate 10 with electrode 60 serves as the collector and collector contact. Control circuitry comprising illustrative devices 51 and 52 is formed in isolated region 15d. Device 51, by way of example, is a buried resistor comprising resistor channel region 51a and contacts 51b-c. Device 52 of FIGS. 4B-C is similar to device 42 of FIG. 4A. As before, these control devices are merely representative of many possible control device arrangements. Electrode 60 provides electrical connection to the bottom contact of power devices 40 or 50. FIG. 4C illustrates the configuration obtained when epitaxial layer 11 is omitted and pedestal 10d (equivalent to 11d) is formed directly in substrate 10.

It should also be noted in FIGS. 4A-C that isolation layer 14 is U-shaped, comprising bottom or buried portion 14b which is substantially parallel to surface 30. As has been previously pointed out, the doping of layer 14 is substantially the same on both bottom portion 14b and wall portions 14a. While wall portions 14a are shown as being vertical, sloping wall portions may also be used. However, they take up additional space. Region 15b of layer 15 is formed within U-shaped isolation layer 14. Both region 15b and layer 14 extend to surface 30.

As is further illustrated in FIG. 4C, additional U-shaped epitaxial layer 70 may be added between layer 14 and layer 15. This may be desirable when, for example, a buried collector structure is needed in connection with the control circuitry formed in region 15b. Like layer 14, layer 70 has wall portions which appear at surface 30 as that contact to the layer 70 may be readily made.

Figure 5A:
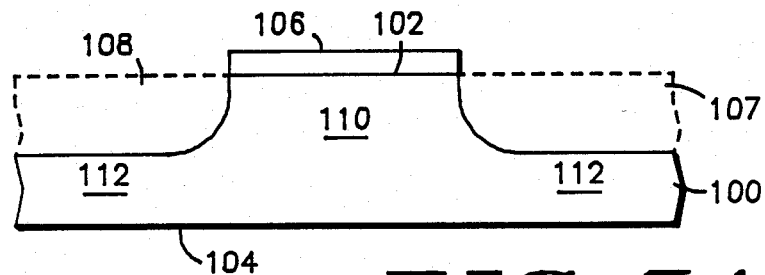
FIGS. 5A-C illustrate, in simplified form, schematic cross sections of a semiconductor device structure at different stages of manufacture according to a still further embodiment of the invention.
Figure 5B:
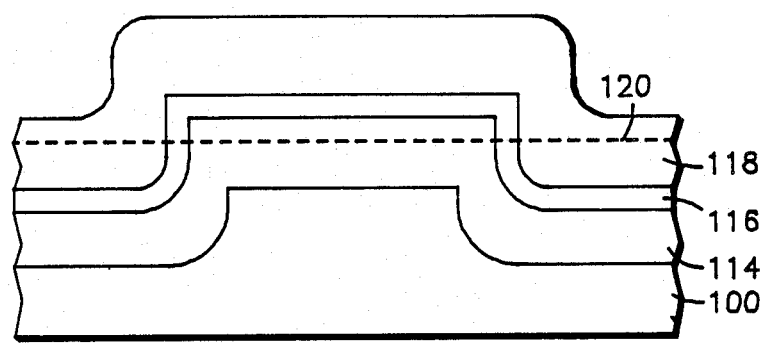
Figure 5C:
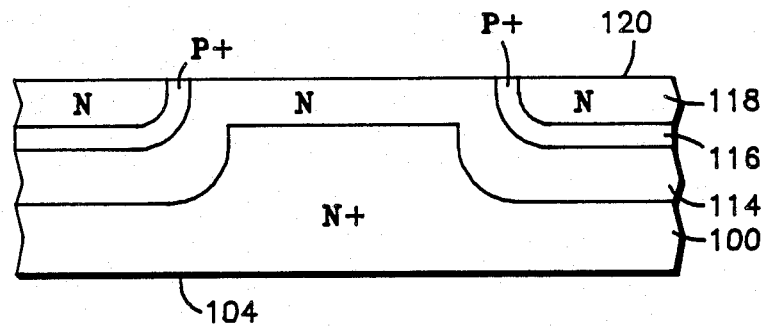

FIGS. 5A-C illustrate, in simplified form, a cross-sectional view through a device structure at various stages of manufacture prepared according to a further embodiment of the invention. For purposes of illustration only, this embodiment of the invention is described in terms of a structure suitable for fabricating a power MOS transistor capable of operating at greater than 1000 volts coupled with CMOS control circuitry. The invention, of course, is not limited to the specific illustrative embodiment.

As illustrated in FIG. 5A, a semiconductor substrate 100 having a top surface 102 and a bottom surface 104 is provided. To provide a low resistance path to a drain contact of the power MOS device, substrate 100 is heavily doped N type silicon having a resistivity of about 0.005 ohm cm. A masking material such as silicon dioxide is applied to surface 102 and photolithographically patterned to form an etch mask 106. The surface of substrate 100 is then etched through openings in etch mask 106 to remove material 107, 108. In this specific example, surface 102 is etched to a depth of about 100 micrometers. The substrate now includes unetched portions 110 which were protected by etch mask 106 and etched portions 112.

The etch mask 106 is removed and then, as illustrated in FIG. 5B, three epitaxial layers 114, 116, 118 are sequentially grown overlying the etched and unetched portions of substrate 100. To fabricate the MOS power transistor and CMOS control circuitry, a first N type epitaxial layer 114 is grown to a thickness of about 80 micrometers and a resistivity of about 60 ohm cm. Epitaxial layer 116, which provides isolation, is grown to a thickness of about 25 micrometers and is doped with boron to a resistivity of about 0.7 ohm cm. N type epitaxial layer 118 in which the control circuitry will be formed is grown to a thickness of about 80 micrometers and a resistivity of about 3.5 ohm cm. Following the formation of the three epitaxial layers, the structure is shaped back by lapping and polishing to a planar surface indicated by the dashed line 120. The shaping back operation removes sufficient material to expose a portion of the first epitaxial layer 114 and to leave that layer having a proper thickness for the implementation of the desired device function. The combined thickness of the second and third epitaxial layers should exceed the depth to which the substrate was etched to allow the structure to be shaped back to a planar surface.

This embodiment has the advantage that only a single epitaxial growth process step is required. The three epitaxial layers are grown sequentially in a single operation by changing flow conditions and dopants. The process need not be interrupted between epitaxial layers, thus eliminating time consuming wafer transfers, reactor purgings, heat ups and cool downs, and the like.

The same advantages are achieved with this embodiment of the invention as are achieved with earlier described embodiments. The epitaxial isolation, achieved in accordance with the invention, allows isolation of much thicker layers than can be isolated by diffusion. Diffusion isolation, for example, requires long diffusion times and results in the use of excessive space on the silicon surface. Isolation of thick layers for a 1000 volt device might require 50-100 hours of diffusion. During the long diffusion, doping profiles in the existing layers change drastically. Also, lateral diffusion in the substrate proceeds at approximately the same rate as does vertical diffusion. An isolation through a 50 micrometer layer will thus be at least 100 micrometers in width, occupying surface area which could otherwise be used for active device area.

Additionally, the process in accordance with the invention allows separate control over the resistivity of each of the device regions, control which is not possible with a diffusion isolated structure. In the illustrative example, the power device is formed in the first epitaxial layer, optimized for that purpose and having a resistivity of 60 ohm cm. The control circuitry is formed in the third epitaxial layer, optimized for that purpose and having a resistivity of 3.5 ohm cm. The advantage is not limited to high voltage devices; a high current, 20 volt device can also benefit from the process in 1 accordance with the invention. For example, the logic portion of the device is optimally fabricated in material having a resistivity of about 1.5-3.5 ohm cm. Even the lower end of this range, however, is too high 5 in resistance to make an optimum high current device. A device made in accordance with the invention can have separately controlled epitaxial layers, each having the correct resistivity for the device function to be implemented. Accordingly, the device size can be 10 reduced in contrast to those fabricated by prior art processes.

The structure attained after the shape back operation is as illustrated in FIG. 5C. This structure, designed for a particular illustrative embodiment as noted above, includes a heavily doped N type substrate 100 with a more lightly doped N type epitaxial layer 114 overlying the substrate and exposed at the surface 120 of a portion of the structure. The N type epitaxial layer is of the resistivity and thickness for the fabrication of a high voltage field effect transistor. The heavily doped substrate provides a low resistance contact between the active drain region and the drain contact (not shown) which will be located on the back surface 104 of the structure. An epitaxial region 118 is doped N type and has a thickness and conductivity designed for the fabrication of CMOS control circuitry. Separating the drain region and the control region is a heavily doped P type region 116 which, by the nature of the fabrication process, surrounds epitaxial region 118 and bends upwardly to intersect surface 120.

The process in accordance with this embodiment of the invention, besides being easier and more economical to implement, provides a structure which has reproduceably higher isolation between the power transistor and the control circuitry. Applicant believes, without wishing to be limited by his theory, that the increased isolation results from the increased and relatively uniform thickness of layer 114 over the etched portion of substrate 100 in contrast to the thickness of region 11e illustrated for example in FIG. 1E. The isolation is further enhanced by grading the doping from light to heavy in the second epitaxial layer so that some of the depletion spread is accommodated in layer two as well as in layer one.

The process illustrated in FIGS. 5A-C have been directed to particular illustrative embodiment. Those skilled in the art will recognize, of course, that the process illustrated can be modified to permit the fabrication of other device and circuit types. For example, the doping types, thicknesses, and resistivities of the substrate and the epitaxial layers can be changed as needed. Further, if necessary for the implementation of a particular device type, more than three epitaxial layers can be grown as parts of the epitaxial deposition step. The fabrication of the various device types is carried out by method steps similar to those illustrated in FIGS. 4A-C.

Being able to independently vary and control the doping type, concentration, and gradient permits the construction of much higher voltage integrated bottom-contact power device - control circuitry structures. Heretofore these have been limited to operating voltage below 500 volts. With the present invention, integrated structures having a bottom-contact power device and top contact control circuitry able to operate above 500 volts and particularly above 1000 volts are practical.

Thus, it is apparent that there has been provided, in accordance with the invention, an improved process for locating top-contact control circuitry and bottom-contact power devices in the same semiconductor wafer or die with isolation therebetween that fully meets the objects and advantages set forth above. There is further achieved an improved process for varying independently the doping type, concentration, and gradient in the regions provided for control circuitry, power devices, and isolation so that each may be optimized independently. The above advantages are provided with fewer steps and achieve more reliable isolation than prior art methods. The present invention is adapted to forming different types of bottom-contact power devices including, but not limited to, MOS transistors, MOS thyristors, bipolar transistors, and two, three, four, or more layer devices.

Having thus described the invention, it will be aparent to those of skill in the art that various modifications can be made within the spirit and scope of the present invention. Accordingly, it is intended to encompass, within the claims which follow, all such modifications.

I claim:
1. A process for manufacturing electrically isolated semiconductor device structures comprising the steps of: providing a semiconductor substrate having a surface; selectively etching portions of said surface to form etched regions and unetched regions; epitaxially forming first, second and third layers overlying said etched and unetched regions; and shaping back said epitaxial layer to form a substantially planar surface and to expose a portion of said first layer overlying said unetched region.

2. The process of claim 1 wherein said substrate, first and third layers are of a first conductivity type and said second layer is of opposite conductivity type.

3. A process for manufacturing electrically isolated semiconductor device structures comprising the steps of: providing a silicon substrate of first conductivity type and resistivity; forming an etch mask on a surface of said substrate, said mask having openings therethrough to expose portions of said surface; etching exposed portions of said surface to form etched regions having mesa-like unetched portions extending upwardly therefrom; forming a first epitaxial layer of said first conductivity type and of higher resistivity overlying said substrate; forming a second epitaxial layer of opposite conductivity type overlying said first epitaxial layer; forming a third epitaxial layer of said first conductivity type overlying said second epitaxial layer; shaping back said epitaxial layers to form a planar surface and to expose a portion of said first epitaxial layer overlying said unetched region; fabricating device regions in said exposed portion of said first epitaxial layer; and fabricating control circuit functions in said third epitaxial layer.

4. The process of claim 3 wherein said step of etching is continued to a predetermined depth and said second and third epitaxial layers have a combined thickness greater than said depth.

5. The process of claim 3 wherein said first, second, and third epitaxial layers are formed in a single epitaxial growth process.

6. The process of claim 3 wherein said step of shaping back comprises lapping and polishing.

7. A process for fabricating a semiconductor device which comprises the steps of: providing a silicon substrate having a surface; selectively etching portions of said surface to a predetermined depth; forming a plurality of epitaxial layers of alternating conductivity type overlying said surface, each of said layers having a predetermined conductivity type and thickness, the first of said layers contacting said substrate; shaping back said epitaxial layers to expose a portion of said first epitaxial layer overlying unetched portions of said surface.

8. The process of claim 7 wherein said plurality of epitaxial layers are formed in s single epitaxial growth process.

* * * * *